United States Patent
Su et al.

(10) Patent No.: US 10,159,143 B1
(45) Date of Patent: Dec. 18, 2018

(54) ATTENUATION REDUCTION STRUCTURE FOR FLEXIBLE CIRCUIT BOARD

(71) Applicant: ADVANCED FLEXIBLE CIRCUITS CO., LTD., Zhongli (TW)

(72) Inventors: Kuo-Fu Su, Zhongli (TW); Chih-Heng Chuo, Bade (TW); Gwun-Jin Lin, Taoyuan (TW)

(73) Assignee: Advanced Flexible Circuits Co., Ltd., Zhongli (TW)

( * ) Notice: Subject to any disclaimer, the term of this patent is extended or adjusted under 35 U.S.C. 154(b) by 0 days.

(21) Appl. No.: 16/044,962

(22) Filed: Jul. 25, 2018

Related U.S. Application Data

(63) Continuation-in-part of application No. 15/920,915, filed on Mar. 14, 2018, which is a continuation-in-part of application No. 15/664,031, filed on Jul. 31, 2017, now Pat. No. 9,942,984.

(51) Int. Cl.
  *H05K 1/00* (2006.01)
  *H05K 1/02* (2006.01)
  *H05K 1/09* (2006.01)

(52) U.S. Cl.
  CPC ........... *H05K 1/0219* (2013.01); *H05K 1/028* (2013.01); *H05K 1/092* (2013.01); *H05K 2201/0272* (2013.01); *H05K 2201/0723* (2013.01)

(58) Field of Classification Search
  CPC .. H05K 1/0218; H05K 1/0237; H05K 1/0393; H05K 1/092; H05K 3/323; H05K 2203/0278; H05K 2201/0715; H05K 9/0088
  See application file for complete search history.

(56) References Cited

U.S. PATENT DOCUMENTS

| | | | | |
|---|---|---|---|---|
| 6,335,492 | B1* | 1/2002 | Terasaka | H01L 23/49811 174/261 |
| 8,766,437 | B2* | 7/2014 | Yamamoto | H05K 3/323 257/737 |
| 9,609,793 | B2* | 3/2017 | Kawaguchi | H05K 9/0088 |
| 2003/0080826 | A1* | 5/2003 | Chen | H01P 5/222 333/117 |

(Continued)

FOREIGN PATENT DOCUMENTS

JP   2006229157 A   *   8/2006

OTHER PUBLICATIONS

English Machine Copy of Kawakami (JP2006229157A).*
Original version of Kawakami (JP2006229157A).*

*Primary Examiner* — Chau N Nguyen
*Assistant Examiner* — Roshn K Varghese
(74) *Attorney, Agent, or Firm* — Rosenberg, Klein & Lee

(57) ABSTRACT

A signal attenuation reduction structure for a flexible circuit board includes at least one conductive paste coating zone formed on surfaces of signal lines and an insulation layer formed on a dielectric layer of the flexible circuit board such that the conductive paste coating zone corresponds to at least one signal line or covers a plurality of signal lines. A resin-based conductive adhesive layer is formed on surfaces of the insulation layer and the conductive paste coating zone of the flexible circuit board. The resin-based conductive adhesive layer is pressed to bond between the conductive paste coating zone and a top insulation layer such that the conductive paste coating zone and the resin-based conductive adhesive layer achieve electrical connection therebetween.

18 Claims, 6 Drawing Sheets

(56) References Cited

U.S. PATENT DOCUMENTS

| | | | | |
|---|---|---|---|---|
| 2006/0248712 A1* | 11/2006 | Jo | ................... | H05K 1/0218 |
| | | | | 29/830 |
| 2008/0143358 A1* | 6/2008 | Breinlinger | .............. | G01R 1/18 |
| | | | | 29/874 |
| 2009/0038839 A1* | 2/2009 | Hashimoto | .......... | H05K 1/0218 |
| | | | | 174/350 |
| 2009/0188702 A1* | 7/2009 | Muro | ................... | H05K 1/0218 |
| | | | | 174/254 |
| 2014/0374147 A1* | 12/2014 | Lin | ..................... | H05K 1/0225 |
| | | | | 174/254 |
| 2015/0250080 A1* | 9/2015 | Haruna | ................ | H05K 1/0215 |
| | | | | 174/394 |
| 2016/0205817 A1* | 7/2016 | Tajima | ................. | H05K 1/0216 |
| | | | | 174/350 |

* cited by examiner

ATTENUATION REDUCTION STRUCTURE FOR FLEXIBLE CIRCUIT BOARD

CROSS-REFERENCES TO RELATED APPLICATIONS

This application is a continuation-in-part of Ser. No. 15/920,915, filed on Mar. 14, 2018, which is a continuation-in-part of Ser. No. 15/664,031 filed on Jul. 31, 2017, now U.S. Pat. No. 9,942,984.

BACKGROUND OF THE INVENTION

1. Field of the Invention

The present invention relates to a signal attenuation shielding structure of a flexible circuit board, and in particular to a signal attenuation reduction structure that is formed by arranging a conductive paste coating zone in a flexible circuit board to correspond to at least one high-frequency signal line and a resin-based conductive adhesive layer arranged to provide electrical connection to the conductive paste coating zone.

2. The Related Arts

For all sorts of electronic devices that are contemporarily available, the amount of data transmitting through signal lines is getting larger and larger and thus, the number of signal transmission lines required is increased and frequencies at which signals are transmitting are also getting higher and higher.

A high frequency signal transmission technique is achieved with two high frequency signal lines that are grouped as a signal pair to respectively transmit signals having identical amplitude, but at opposite phases so that the signal transmission lines are provided with an improved effect of suppressing electromagnetic interference.

Although such a high frequency transmission technique greatly improves potential problems that might occur in the transmission of signals, yet poor designs may often cause problems, such as signal reflection, dispersion of electromagnetic wave, loss of signal in transmission and receipt, and signal waveform distortion, in actual applications.

To suppress problems concerning interference of electromagnetic wave radiation and impedance match occurring in a high frequency signal line of a flexible circuit board, it is common to adopt a structure including a copper- or aluminum-based shielding layer; however, the thickness involved is relatively large and flexibility is poor. It is also common heretofore to form such a shielding layer by coating a silver paste layer; however, material cost is high and manufacturing processes are complicated.

SUMMARY OF THE INVENTION

In view of the drawbacks of the prior art, an objective of the present invention is to provide a high-frequency signal attenuation reduction structure that is formed by combining a conductive paste coating zone and a resin-based conductive adhesive layer together.

The technical solution that the present invention adopts to achieve the above objective is that at least one conductive paste coating zone is formed on a surface of high-frequency signal lines and an insulation layer that are formed on a dielectric layer of a flexible circuit board such that the conductive paste coating zone corresponds to at least one high-frequency signal line or covers a plurality of signal lines. A resin-based conductive adhesive layer is formed on surfaces of the insulation layer and the conductive paste coating zone of the flexible circuit board. The resin-based conductive adhesive layer is pressed to bond between the conductive paste coating zone and a top insulation layer such that the conductive paste coating zone and the resin-based conductive adhesive layer achieve electrical connection therebetween.

In the above solution, the conductive paste coating zone is formed of a conductive paste selected from one of silver paste, copper paste, and aluminum paste.

In the above solution, the dielectric layer comprises at least one grounding line formed thereon.

In the above solution, the resin-based conductive adhesive layer is pressed at a predetermined temperature and a predetermined pressure to bond between the conductive paste coating zone and the top insulation layer.

In the above solution, the plurality of pairs of high-frequency signal lines comprise at least one pair of differential-mode signal lines.

In another embodiment of the present invention, the conductive paste coating zone is coated in an area that covers a plurality of pairs of high-frequency signal lines.

The present invention offers advantages including having a smaller thickness and better flexibility. The present invention also offers advantages of low material cost and simplified manufacturing process.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
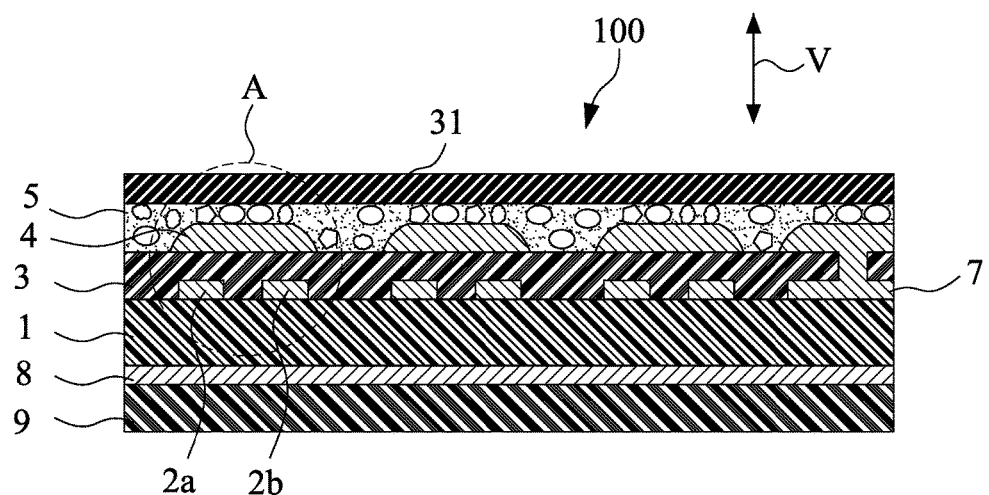
FIG. 1 is a cross-sectional diagram showing a first embodiment of the present invention.
Figure 2:
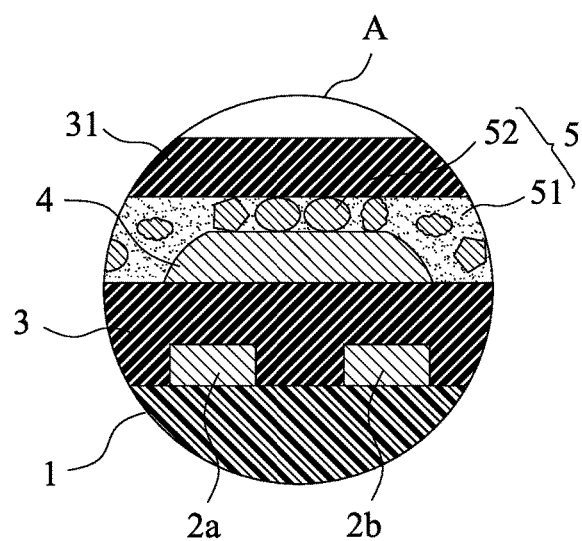
FIG. 2 is an enlarged view of a circle portion "A" of FIG. 1.

Referring collectively to FIGS. 1 and 2, FIG. 1 is a cross-sectional diagram showing a first embodiment of the present invention and FIG. 2 is an enlarged view of a circle portion "A" of FIG. 1. As shown in the drawings, a flexible circuit board 100 comprises a dielectric layer 1 on which a plurality of pairs of high-frequency signal lines 2a, 2b that are adjacent to and insulated from each other are formed. An insulation layer 3 is formed on the plurality of pairs of the high-frequency signal lines 2a, 2b and a top surface of the dielectric layer 1.

The insulation layer 3 of the flexible circuit board 100 has a surface on which a plurality of conductive paste coating zones 4 are formed through coating and each of the conductive paste coating zones 4 has a coating area that corresponds to one of the pairs of high-frequency signal lines 2a, 2b. The conductive paste coating zones 4 are formed of a conductive paste selected from one of silver paste, copper paste, and aluminum paste.

A resin-based conductive adhesive layer 5 is formed on the surfaces of the insulation layer 3 and the conductive paste coating zones 4 of the flexible circuit board 100. The resin-based conductive adhesive layer 5 is made of a sticky resin material 51 containing a plurality of conductive particles 52 therein as illustrated in FIG. 2. The content of the conductive particles 52 in the resin-based conductive adhesive layer 5 ranges from 10 to 50 vol % relative to the total volume of the sticky resin material 51. The particle size of each of the conductive particles 52 of the resin-based conductive adhesive layer 5 may be identical and ranges from 2 to 30 μm. The particle density of the conductive particles 52 in the sticky resin material 51 may be changed, dependent on required electrical conductivity and/or electromagnetic shielding performance. As result, the resin-based conductive adhesive layer 5 may reverse as an electrical conductive layer and/or an electromagnetic shielding layer for the flexible circuit board 100.

Alternatively, the conductive particles 52 of the resin-based conductive adhesive layer 5 may comprise at least two groups of conductive particles with different particle sizes. For example, a first group conductive particles each having particle size ranged from 2 to 10 μm, and a second group conductive particles each having particle size ranged from 10 to 30 μm.

Further, the conductive particles 52 of the resin-based conductive adhesive layer 5 may comprise various particle sizes with different outward contours as particularly shown in FIG. 2.

A top insulation layer 31 is formed on the resin-based conductive adhesive layer 5, so that the top insulation layer 31 is set to cover, via the resin-based conductive adhesive layer 5, the surface of the insulation layer 3 and the surface of the conductive paste coating zones 4 of the flexible circuit board 100. Preferably, the resin-based conductive adhesive layer 5 is an anisotropic conductive film. The resin-based conductive adhesive layer 5 is pressed, at a predetermined temperature and a predetermined pressure, to bond between the conductive paste coating zones 4 and the top insulation layer 31. Thereby, the conductive paste coating zones 4 and the resin-based conductive adhesive layer 5 establish an electrical connection therebetween in the vertical direction V (namely Z-axis direction) through at least one conductive particle 52 electrically contacted on the top surface of the conductive paste coating zone 4, as shown in FIG. 2. The dielectric layer 1 comprises at least one grounding line 7 formed thereon. If required, the grounding line 7 may be electrically connected, via a known conductive path, to one of the conductive paste coating zones 4. The dielectric layer 1 has an underside on which a conductive layer 8 is formed thereon, and then a lower insulation layer 9 is further formed on the conductive layer 8.

The plurality of pairs of the high-frequency signal lines 2a, 2b comprise at least one pair of differential-mode signal lines for transmission of differential-mode signals and may also comprise a common-mode signal lines for transmission of common-mode signals.

Figure 2A:
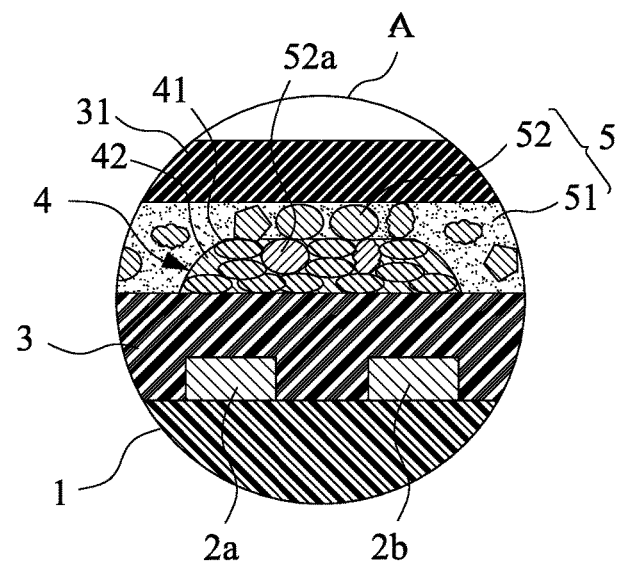
FIG. 2A is a further enlarged view of FIG. 2, showing that parts of conductive particles of the resin-based conductive adhesive layer are bound to gaps formed among conductive paste particles of conductive paste coating zone.

With reference to FIG. 2A, it further illustrates that the conductive paste coating zone 4 mainly contains a number of conductive paste particles 41 suspended in a resin paste material 42. The conductive paste particles 41 in the conductive paste coating zones 4 are partially in contact to each other to cause a required electrically conductivity.

As can be seen in FIG. 2A, after a predetermined pressure at a predetermined temperature is applied to the resin-based conductive adhesive layer 5 toward the conductive paste coating zone 4, parts of the conductive particles 52a of the resin-based conductive adhesive layer 5 are bound to gaps formed among the conductive paste particles 41 of the conductive paste coating zone 4 and are in electrically contact with the adjacent conductive paste particles 41, thereby causing an electrical conductivity between the conductive paste coating zone 4 and the resin-based conductive adhesive layer 5.

Figure 3:
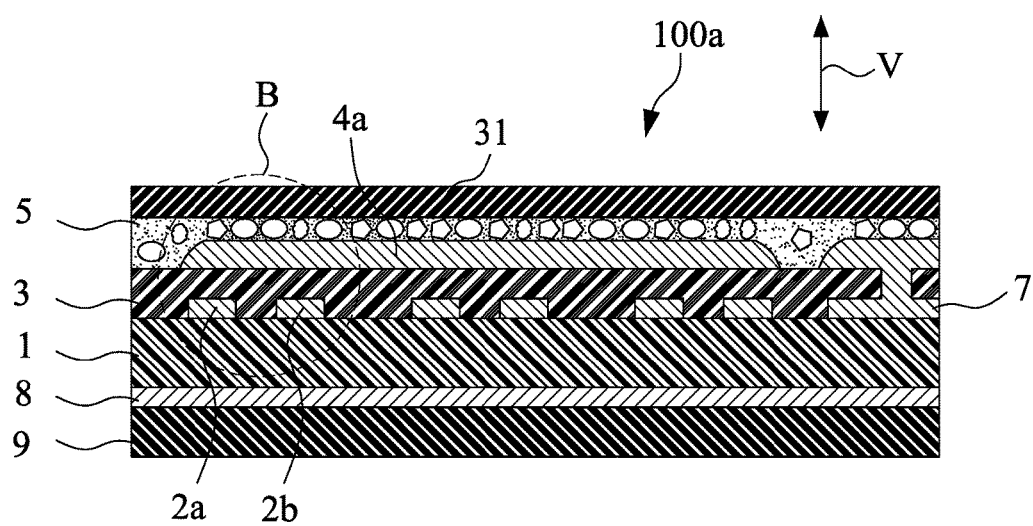
FIG. 3 is a cross-sectional diagram showing a second embodiment of the present invention.
Figure 4:
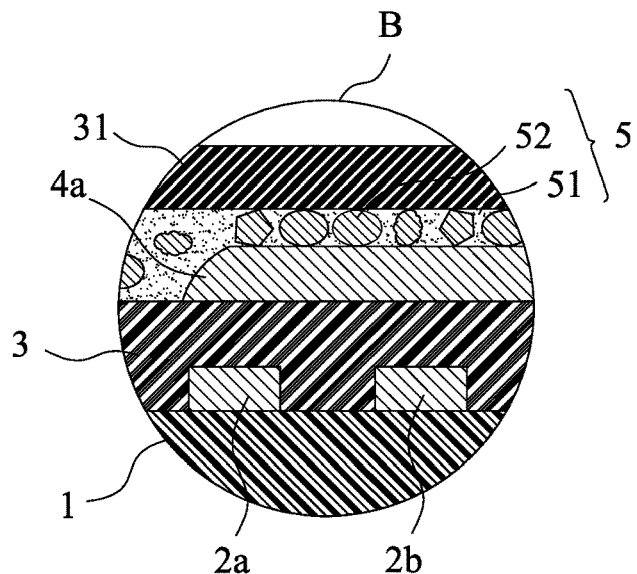
FIG. 4 is an enlarged view of a circle portion "B" of FIG. 3.

FIG. 3 is a cross-sectional diagram showing a second embodiment of the present invention. FIG. 4 is an enlarged view of a circle portion "B" of FIG. 3. The instant embodiment comprises components/parts that are generally similar to those of the first embodiment and similar components/parts are designated with the same reference numerals for consistency. In the instant embodiment, the flexible circuit board 100a similarly comprises a dielectric layer 1, a plurality of pairs of high-frequency signal lines 2a, 2b that are adjacent to and insulated from each other, an insulation layer 3, a resin-based conductive adhesive layer 5, a top insulation layer 31, a grounding line 7, a conductive layer 8, and a lower insulation layer 9.

In the instant embodiment, a top surface of the insulation layer 3 is coated and thus formed with an extended conductive paste coating zone 4a, and the extended conductive paste coating zone 4a has an extended coating area that correspondingly covers the plurality of pairs of the high-frequency signal lines 2a, 2b. The extended conductive paste coating zone 4a is formed of conductive paste that comprises one of silver paste, copper paste, and aluminum paste.

The top insulation layer 31 is set to cover, via the resin-based conductive adhesive layer 5, the surface of the insulation layer 3 and the extended conductive paste coating zone 4a of the flexible circuit board 100a. The resin-based conductive adhesive layer 5 is pressed, at a predetermined temperature and a predetermined pressure, to bond between the extended conductive paste coating zone 4a and the top insulation layer 31. The extended conductive paste coating zone 4a and the resin-based conductive adhesive layer 5 achieve an electrical connection therebetween in the vertical direction V (namely Z-axis direction) through at least one conductive particle 52 electrically contacted on the top surface of the conductive paste coating zone 4a.

Figure 4A:
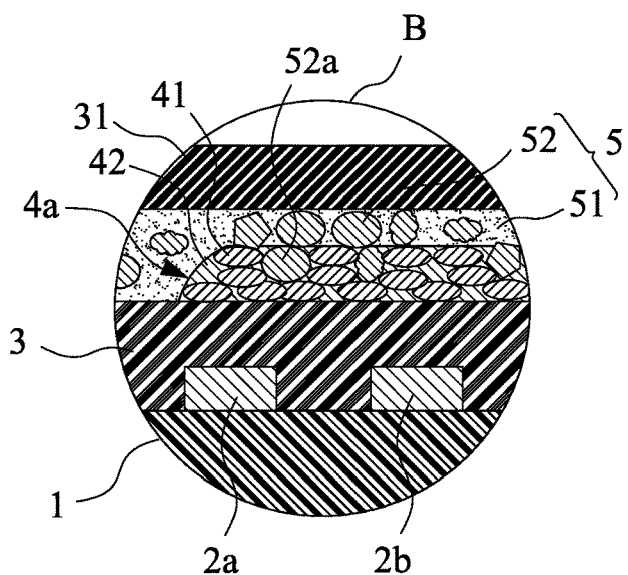
FIG. 4A is a further enlarged view of FIG. 4, showing that parts of conductive particles of resin-based conductive adhesive layer are bound to gaps formed among conductive paste particles of conductive paste coating zone.

With reference to FIG. 4A, it further illustrates that the conductive paste coating zone 4 mainly contains a number of conductive paste particles 41 suspended in a resin paste material 42. The conductive paste particles 41 in the conductive paste coating zones 4 are partially in contact to each other to cause a required electrically conductivity.

As can be seen in FIG. 4A, after a predetermined pressure at a predetermined temperature is applied to the resin-based conductive adhesive layer 5 toward the conductive paste coating zone 4, parts of the conductive particles 52a of the resin-based conductive adhesive layer 5 are bound to gaps formed among the conductive paste particles 41 of the conductive paste coating zone 4 and are in electrically contact with the adjacent conductive paste particles 41, thereby causing an electrical conductivity between the conductive paste coating zone 4 and the resin-based conductive adhesive layer 5.

Figure 5:
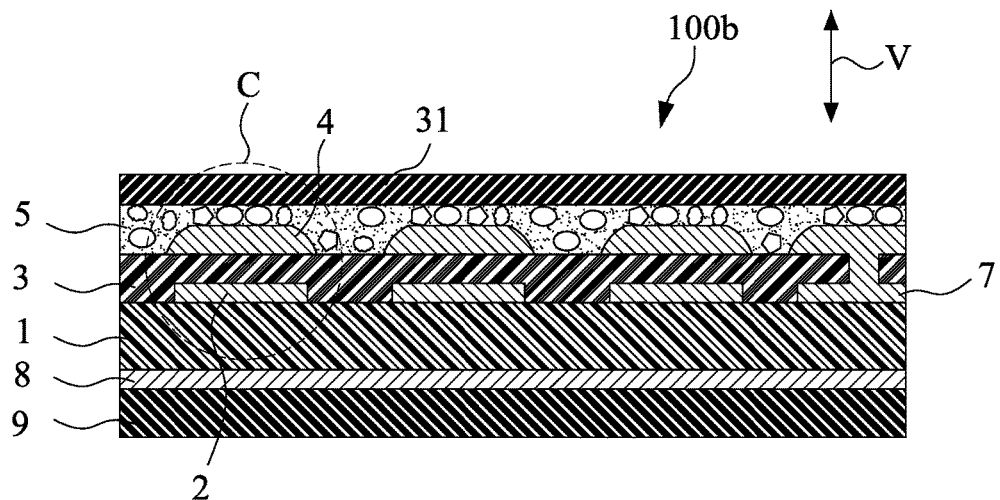
FIG. 5 is a cross-sectional diagram showing a third embodiment of the present invention.
Figure 6:
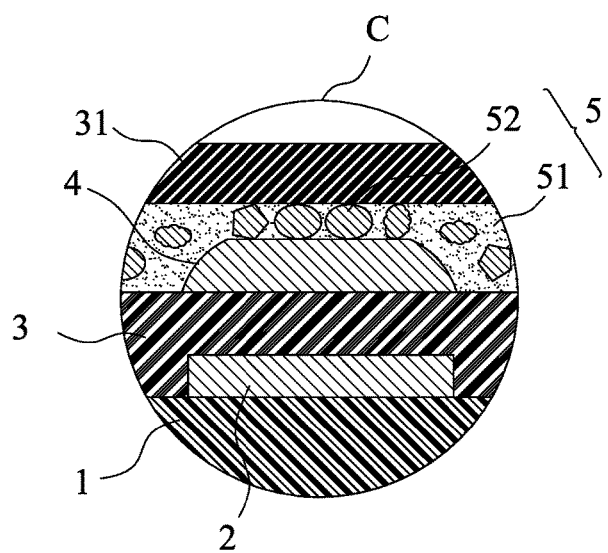
FIG. 6 is an enlarged view of a circle portion "C" of FIG. 5.

FIG. 5 is a cross-sectional diagram showing a third embodiment of the present invention. FIG. 6 is an enlarged view of a circle portion "C" of FIG. 5. In the instant embodiment, the flexible circuit board 100b comprises a dielectric layer 1 and at least one signal line 2 formed on the top surface of the dielectric layer 1. The signal line 2 is disposed for high-frequency applications. For example, the signal line 2 may be used as a radio frequency signal transmission line for antenna.

At least one conductive paste coating zone 4 is formed on the insulation layer 3 and corresponding to the signal line 2. A resin-based conductive adhesive layer 5 is formed on the insulation layer 3 and the conductive paste coating zone 4, made of different material composition from the conductive paste coating zone 4 and including a sticky resin material 51 containing a plurality of conductive particles 52 therein, as shown in FIG. 6.

A top insulation layer 31 is formed on the resin-based conductive adhesive layer 5. The conductive paste coating zones 4 and the resin-based conductive adhesive layer 5 establish an electrical connection therebetween in the vertical direction V (namely Z-axis direction) through at least one conductive particle 52 electrically contacted on the top surface of the conductive paste coating zone 4.

Figure 6A:
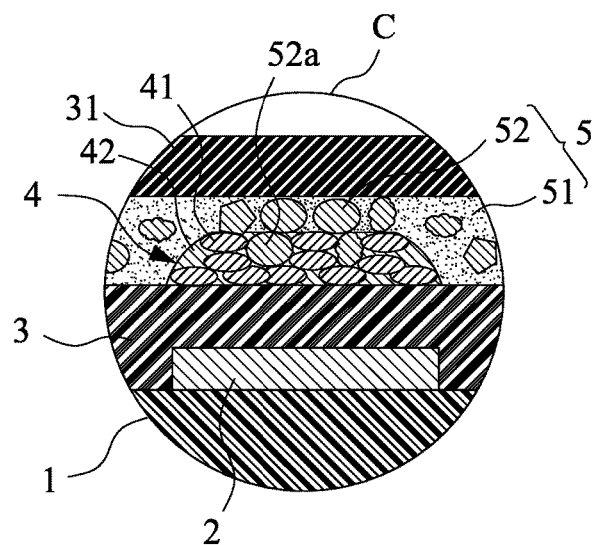
FIG. 6A is a further enlarged view of FIG. 6, showing that parts of conductive particles of the resin-based conductive adhesive layer are bound to gaps formed among conductive paste particles of conductive paste coating zone.

With reference to FIG. 6A, it further illustrates that the conductive paste coating zone 4 mainly contains a number of conductive paste particles 41 suspended in a resin paste material 42. The conductive paste particles 41 in the conductive paste coating zones 4 are partially in contact to each other to cause a required electrically conductivity.

As can be seen in FIG. 6A, after a predetermined pressure at a predetermined temperature is applied to the resin-based conductive adhesive layer 5 toward the conductive paste coating zone 4, parts of the conductive particles 52a of the resin-based conductive adhesive layer 5 are bound to gaps formed among the conductive paste particles 41 of the conductive paste coating zone 4 and are in electrically contact with the adjacent conductive paste particles 41, thereby causing an electrical conductivity between the conductive paste coating zone 4 and the resin-based conductive adhesive layer 5.

Figure 7:
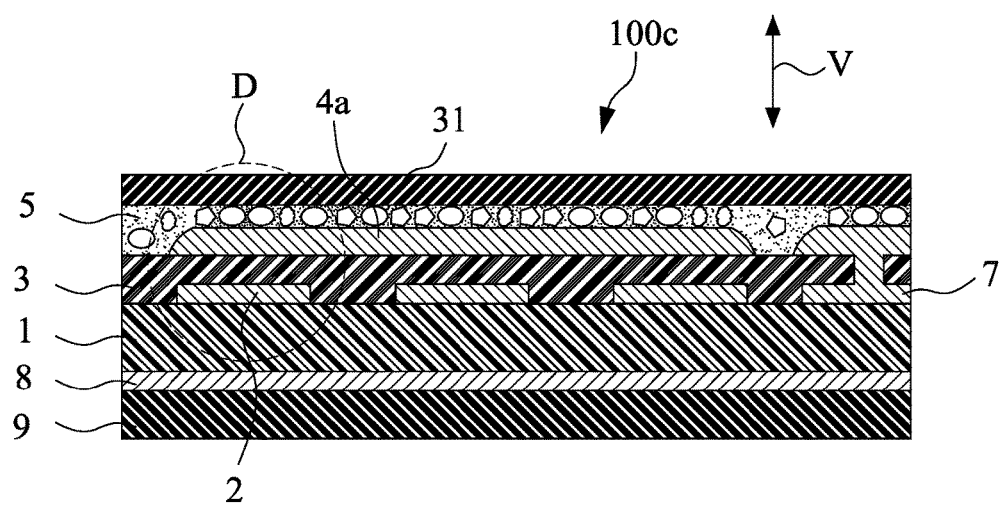
FIG. 7 is a cross-sectional diagram showing a fourth embodiment of the present invention.
Figure 8:
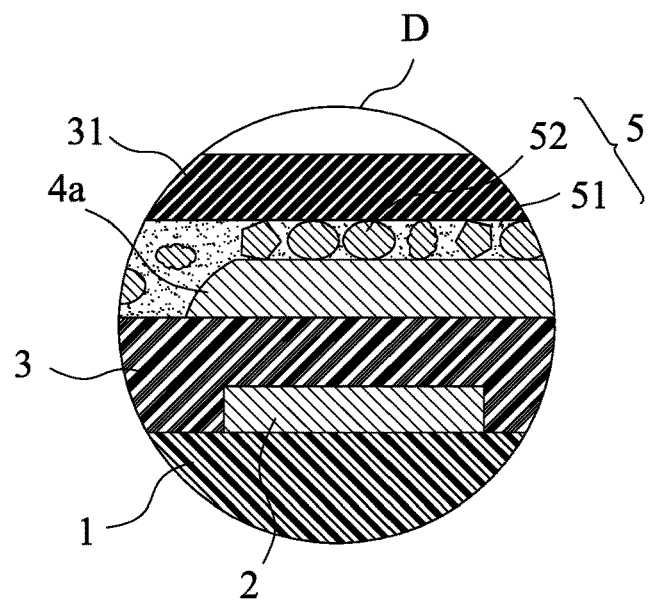
FIG. 8 is an enlarged view of a circle portion "D" of FIG. 7.

FIG. 7 is a cross-sectional diagram showing a fourth embodiment of the present invention. FIG. 8 is an enlarged view of a circle portion "D" of FIG. 7. In the instant embodiment, the flexible circuit board 100c comprises a dielectric layer 1 and a plurality of signal lines 2 formed on the top surface of the dielectric layer 1. At least one of the signal lines 2 is disposed for high-frequency applications. For example, the at least one signal line 2 may be used as a radio frequency signal transmission line for antenna.

An extended conductive paste coating zone 4a is formed on the insulation layer 3 and has an extended coating area that correspondingly covers the plurality of signal lines 2. A resin-based conductive adhesive layer 5 is formed on the insulation layer 3 and the extended conductive paste coating zone 4a, made of different material composition from the extended conductive paste coating zone 4a and including a sticky resin material 51 containing a plurality of conductive particles 52 therein, as shown in FIG. 8.

A top insulation layer 31 is formed on the resin-based conductive adhesive layer 5. The extended conductive paste coating zones 4a and the resin-based conductive adhesive layer 5 establish an electrical connection therebetween in the vertical direction V (namely Z-axis direction) through at least one conductive particles 52 electrically contacted on the top surface of the conductive paste coating zone 4.

Figure 8A:
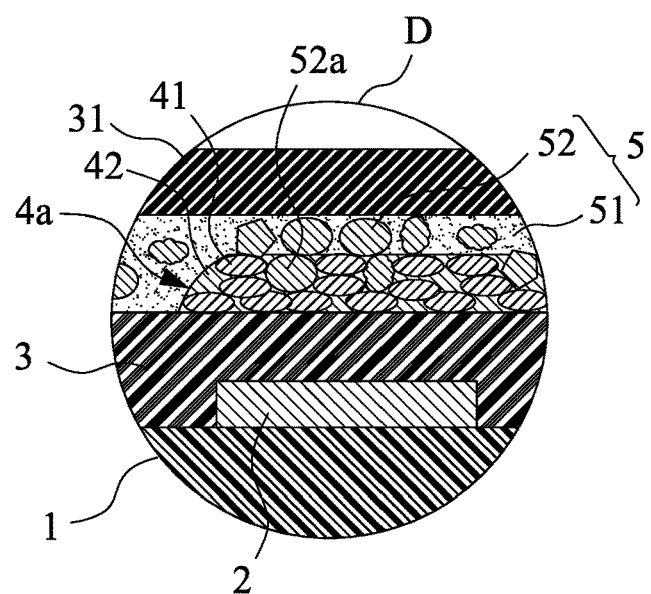
FIG. 8A is a further enlarged view of FIG. 8, showing that parts of conductive particles of the resin-based conductive adhesive layer are bound to gaps formed among conductive paste particles of conductive paste coating zone.

With reference to FIG. 8A, it further illustrates that the conductive paste coating zone 4 mainly contains a number of conductive paste particles 41 suspended in a resin paste material 42. The conductive paste particles 41 in the conductive paste coating zones 4 are partially in contact to each other to cause a required electrically conductivity.

As can be seen in FIG. 8A, after a predetermined pressure at a predetermined temperature is applied to the resin-based conductive adhesive layer 5 toward the conductive paste coating zone 4, parts of the conductive particles 52a of the resin-based conductive adhesive layer 5 are bound to gaps formed among the conductive paste particles 41 of the conductive paste coating zone 4 and are in electrically contact with the adjacent conductive paste particles 41, thereby causing an electrical conductivity between the conductive paste coating zone 4 and the resin-based conductive adhesive layer 5.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flexible circuit board, comprising:
    a dielectric layer having a top surface;
    at least one signal line disposed for high-frequency applications, the at least one signal line being formed on the top surface of the dielectric layer;
    an insulation layer formed on the at least one signal line and the top surface of the dielectric layer;
    at least one conductive paste coating zone formed on the insulation layer and corresponding to the at least one signal line, containing a plurality of conductive paste particles suspended in a resin paste material;
    a resin-based conductive adhesive layer formed on the insulation layer and the at least one conductive paste coating zone, the resin-based conductive adhesive layer containing a sticky resin material and a plurality of conductive particles therein, and the resin-based conductive adhesive layer being made of different material composition from the at least one conductive paste coating zone; and
    a top insulation layer formed on the resin-based conductive adhesive layer;
    wherein the at least one conductive paste coating zone is disposed in embedded manner within the resin-based conductive adhesive layer, regions of the resin-based conductive adhesive layer thereby extending between the at least one conductive paste coating zone and the top insulation layer, and an electrical connection is established between the at least one conductive paste coating zone and the resin-based conductive adhesive layer through at least one of the plurality of conductive particles.

2. The flexible circuit board as claimed in claim 1, wherein the at least one conductive paste coating zone is formed of a conductive paste selected from one of silver paste, copper paste, and aluminum paste.

3. The flexible circuit board as claimed in claim 1, wherein the dielectric layer includes at least one grounding line formed thereon.

4. The flexible circuit board as claimed in claim 1, wherein the resin-based conductive adhesive layer is pressed at a predetermined temperature and a predetermined pressure to bond between the at least one conductive paste coating zone and the top insulation layer.

5. The flexible circuit board as claimed in claim 1, wherein each of the conductive particles has an identical particle size.

6. The flexible circuit board as claimed in claim 1, wherein the conductive particles comprise at least two groups of conductive particles with different particle sizes.

7. The flexible circuit board as claimed in claim 1, wherein the at least one of the plurality of conductive particles of the resin-based conductive adhesive layer is contacted on a top surface of the at least one conductive paste coating zone.

8. The flexible circuit board as claimed in claim 1, wherein the at least one of the plurality of conductive particles of the resin-based conductive adhesive layer is bound to at least one gap formed among the conductive paste particles of the conductive paste coating zone and is in electrically contact with at least one of the conductive paste particles, thereby causing an electrical conductivity between the conductive paste coating zone and the resin-based conductive adhesive layer.

9. The flexible circuit board as claimed in claim 1, wherein the resin-based conductive adhesive layer is an anisotropic conductive film.

10. A flexible circuit board, comprising:
a dielectric layer having a top surface;
a plurality of signal lines adjacent to and insulated from each other, formed on the top surface of the dielectric layer, at least one of the plurality of signal lines being disposed for high-frequency applications;
an insulation layer formed on the plurality of signal lines and the top surface of the dielectric layer;
an extended conductive paste coating zone formed on the insulation layer and corresponding to the plurality of signal lines, containing a plurality of conductive paste particles suspended in a resin paste material;
a resin-based conductive adhesive layer formed on the insulation layer and the extended conductive paste coating zone, the resin-based conductive adhesive layer containing a sticky resin material and a plurality of conductive particles therein, and the resin-based conductive adhesive layer being made of different material composition from the extended conductive paste coating zone; and
a top insulation layer formed on the resin-based conductive adhesive layer;
wherein the extended conductive paste coating zone is disposed in embedded manner within the resin-based conductive adhesive layer, a region of the resin-based conductive adhesive layer thereby extending between the extended conductive paste coating zone and the top insulation layer, and an electrical connection is established between the extended conductive paste coating zone and the resin-based conductive adhesive layer through the plurality of conductive particles.

11. The flexible circuit board as claimed in claim 10, wherein the extended conductive paste coating zone is formed of a conductive paste selected from one of silver paste, copper paste, and aluminum paste.

12. The flexible circuit board as claimed in claim 10, wherein the dielectric layer includes at least one grounding line formed thereon.

13. The flexible circuit board as claimed in claim 10, wherein the resin-based conductive adhesive layer is pressed at a predetermined temperature and a predetermined pressure to bond between the extended conductive paste coating zone and the top insulation layer.

14. The flexible circuit board as claimed in claim 10, wherein each of the conductive particles has an identical particle size.

15. The flexible circuit board as claimed in claim 10, wherein the conductive particles comprise at least two groups of conductive particles with different particle sizes.

16. The flexible circuit board as claimed in claim 10, wherein the at least one of the plurality of conductive particles of the resin-based conductive adhesive layer is contacted on a top surface of the extended conductive paste coating zone.

17. The flexible circuit board as claimed in claim 10, wherein the at least one of the plurality of conductive particles of the resin-based conductive adhesive layer is bound to at least one gap formed among the conductive paste particles of the extended conductive paste coating zone and is in electrically contact with at least one of the conductive paste particles, thereby causing an electrical conductivity between the extended conductive paste coating zone and the resin-based conductive adhesive layer.

18. The flexible circuit board as claimed in claim 10, wherein the resin-based conductive adhesive layer is an anisotropic conductive film.

* * * * *